United States Patent [19]

Geller et al.

[11] Patent Number: 5,125,109
[45] Date of Patent: Jun. 23, 1992

[54] LOW NOISE BLOCK DOWN-CONVERTER FOR DIRECT BROADCAST SATELLITE RECEIVER INTEGRATED WITH A FLAT PLATE ANTENNA

[75] Inventors: Bernard D. Geller, Rockville; Amir I. Zaghloul, Bethesda, both of Md.

[73] Assignee: Comsat, Washington, D.C.

[21] Appl. No.: 210,433

[22] Filed: Jun. 23, 1988

[51] Int. Cl.⁵ .................. H04B 1/26; H01Q 1/00
[52] U.S. Cl. .................. 455/313; 455/327; 343/700 MS
[58] Field of Search .............. 343/700 MS; 455/323, 455/325, 327, 328, 313, 205, 317

[56] References Cited

U.S. PATENT DOCUMENTS

| | | | |
|---|---|---|---|
| 4,477,813 | 10/1984 | Weiss | 343/700 MS |
| 4,491,976 | 1/1985 | Southoh et al. | 455/325 |
| 4,527,136 | 7/1985 | Kamiya | 455/3 |
| 4,542,300 | 9/1985 | Nagatomi | 455/3 |
| 4,596,047 | 6/1986 | Watanabe et al. | 455/327 |
| 4,679,249 | 7/1987 | Tanaka et al. | 455/327 |

Primary Examiner—Reinhard J. Eisenzopf
Assistant Examiner—Lisa Charouel
Attorney, Agent, or Firm—Sughrue, Mion, Zinn, Macpeak & Seas

[57] ABSTRACT

A compact multi-layer flat antenna structure incorporating a low noise block down-converter on the power divider network layer of the antenna. RF circuit losses are reduced, and the antenna/receiver combination is made more compact, for flush mounting. The antenna/receiver combination finds particular utility in direct broadcast satellite (DBS) applications for single or dual orthogonal polarizations. The connection between the antenna and receiver may be implemented in stripline/coplanar waveguide, or other known technologies such as microstrip, slotline, and finline.

7 Claims, 2 Drawing Sheets

LOW NOISE BLOCK DOWN-CONVERTER FOR DIRECT BROADCAST SATELLITE RECEIVER INTEGRATED WITH A FLAT PLATE ANTENNA

BACKGROUND OF THE INVENTION

The present invention relates to a multi-layer flat plate printed circuit antenna, wherein elements of adjacent layers are capacitively coupled to each other. A flat plate receiver is incorporated into and cuts through one or more of the layers, providing a more compact structure and improved sensitivity.

The present invention is another of a progression of inventions on which a number of related, copending applications have been filed. U.S. Pat. No. 4,761,654, Zaghloul, relates to a multi-layer printed circuit antenna employing capacitive coupling among the layers. U.S. Pat. No. 5,005,019, Zaghloul, relates to a printed circuit antenna employing capacitive coupling, wherein radiating elements are slots.

The antennas disclosed and claimed in each of the above-mentioned applications operates in a single sense of polarization, which may be either circular or linear, depending on the configuration of the elements, the elements being fed by respective single feedlines in a power divider network (PDN). U.S. Pat. No. 4,929,959, Sorbello et al., relates to a multi-layer dual-polarization structure, wherein two different orthogonal senses of polarization may be received by a single antenna. The disclosures of all of those copending, commonly assigned applications are incorporated herein by reference.

The antenna disclosed in each of the above-mentioned copending applications, whether implemented in microstrip, stripline, slotline, finline, or coplanar waveguide technologies, requires an amplifier box (a low noise block down-converter, or LNB) which is constructed outside of the antenna structure itself. While this structure works well, it has several deficiencies. First, by requiring coupling of the antenna to an LNB outside of the antenna, there is inherent RF circuit loss. Thus, the receiver has reduced sensitivity. Second, because the receiver box is separate from the antenna, mounting of the overall structure is more difficult and restricted because of its large size.

SUMMARY OF THE INVENTION

The present inventors have discovered that it is possible to bring the LNB within the boundaries of the antenna layers, including the layer in which the power divider network (PDN) is provided. Because the LNB takes up a certain amount of space, some portion of the power divider network must be omitted, and corresponding radiating elements, be they slots or patches, also are omitted. In order to minimize deleterious effects, and whenever practical, the omitted elements are chosen from a region in the array which does not radiate as efficiently as other regions. By bringing the LNB onto the PDN layer, RF sensitivity of the receiver is improved, as circuit losses are reduced. Also, mounting, including flush mounting, is facilitated because the LNB does not stick out of the back of the flat antenna.

In view of the foregoing, the present invention provides a multi-layer antenna structure comprising a ground plane; a power divider network array disposed over the ground plane; and a layer of radiating elements disposed over the power divider network, wherein all of these layers are capacitively coupled to each other.

The PDN layer further comprises an LNB disposed on a substrate on the layer, some of the elements of the PDN being omitted to make room for the LNB, and corresponding radiating elements in the radiating element layer being omitted, as there would be no feed structure for those elements because of the presence of the LNB. The substrate on which the LNB is disposed preferably is low loss ceramic or glass. The present inventors have discovered that this structure, while requiring the elimination of several elements, provides improved results over a wide bandwidth.

BRIEF DESCRIPTION OF THE DRAWINGS

The foregoing and other objects and features of the present invention now will be described in detail with reference to the accompanying drawings, in which.

DETAILED DESCRIPTION OF THE PREFERRED EMBODIMENT

The embodiment which now will be described as presently preferred, incorporates stripline implementation of the antenna, with connection to a coplanar waveguide structure outside of the antenna. However, it is within the contemplation of the present invention to provide implementation in microstrip, slotline, finline or other known technologies.

Figure 1:
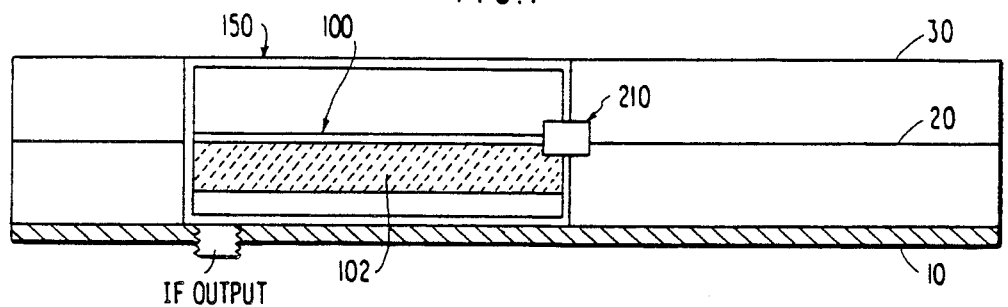
FIG. 1 shows a single-polarization multi-layer structure. incorporating an LNB.

Referring to FIG. 1, the flat plate array antenna in which the LNB box 150 is integrated has a multi-layer structure, including a ground plane 10, a power distribution network (PDN) layer 20, and a radiating element layer 30. The PDN layer 20 is printed in stripline form, with lines feeding the corresponding radiating elements in a capacitively coupled manner, with no direct contact between the lines and the elements. A bottom ground plane is provided as the bottom layer of the structure, with the layer containing the radiating elements acting as a top ground plane.

The LNB receiver 100 preferably is provided on a ceramic or a glass substrate 102, at a center of the power divider network, as this provides the lowest loss implementation. With this configuration, it is possible to omit certain ones of the radiating elements toward the center of the layer 30, and to position the LNB box 150 where these elements are removed. The "omitted" elements referred to above may be any of the elements described in any of the above-mentioned copending applications.

It is known to "omit" certain radiating elements in an array, but for different reasons than in the present invention. For example, some known antennas, such as a model manufactured by Sony Corporation, do not have some radiating elements where mounting brackets and other hardware (such as connections to an externally-located LNB box) are connected to the antenna.

While placing the LNB box 150 at the center of the PDN layer 20 provides the lowest loss, as the feed to the layer 20 is at the center of the array, it is within the contemplation of the invention to accommodate situations in which an array may be tapered in such a manner that certain portions of the array do not contribute greatly to overall antenna performance, i.e., certain elements are not excited or are weakly excited. In such tapered arrays, the feed structure for these unexcited elements may be replaced by the LNB box.

Figure 2A:
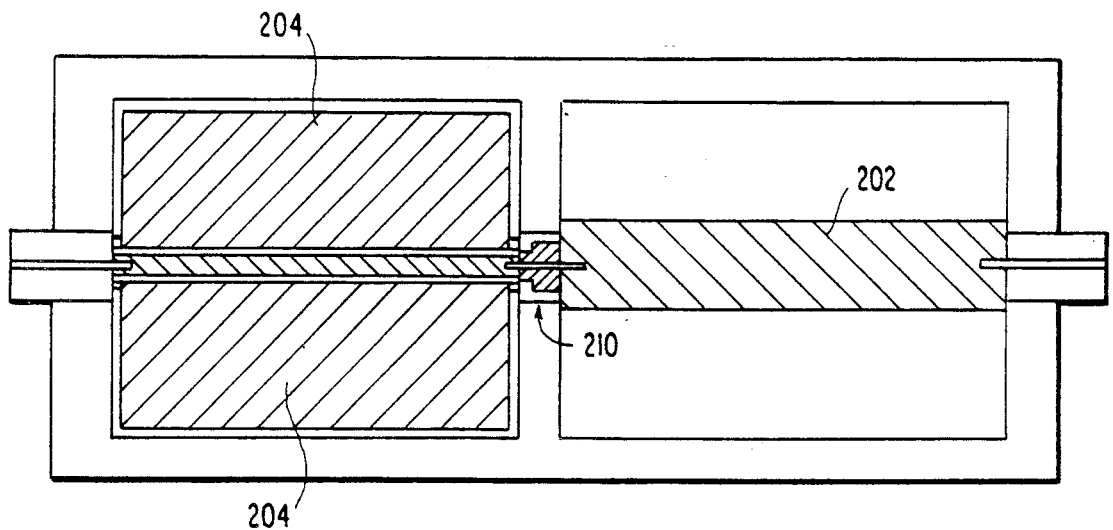
FIGS. 2A and 2B are plan and side views, respectively, of a connection of the stripline power divider network to a coplanar waveguide structure in accordance with a preferred embodiment.
Figure 2B:
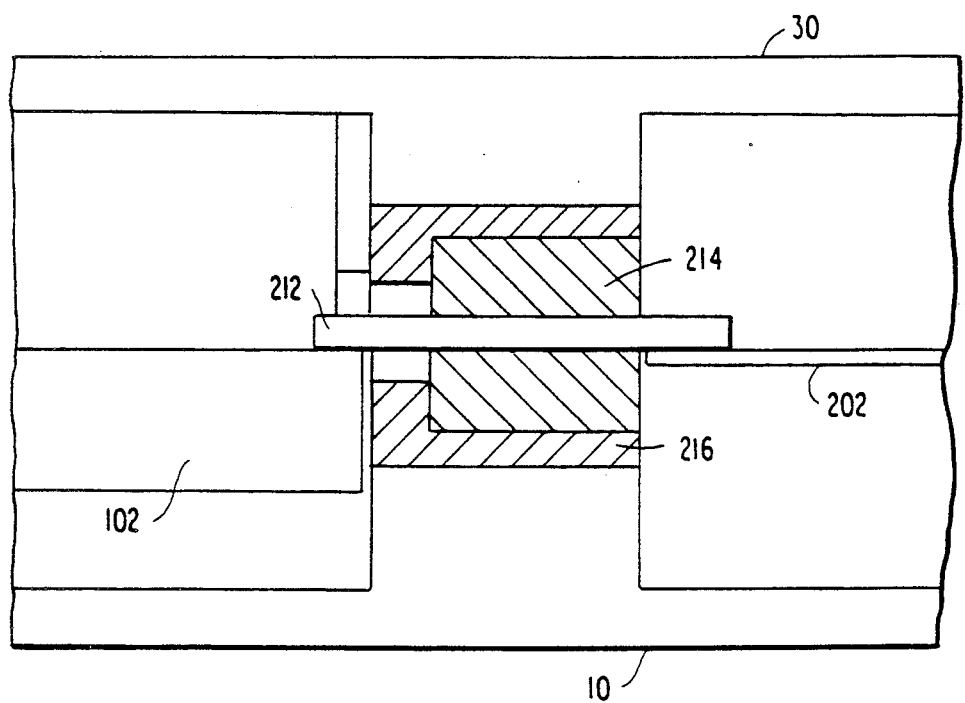

FIGS. 2A and 2B show top and side views of a coaxial transition 210 between the stripline 202 in the antenna power dividing network and the coplanar waveguide 204 outside the network. The stripline 202 and the coplanar waveguide (CPW) 204 are impedance matched. The outer portion 216 of the coaxial transition 210 is connected to the ground plane 10 and to the radiating element layer 30 which acts as the upper ground plane for the stripline structure. The coaxial connection on the CPW side is contacted to ground planes which are disposed orthogonally to the ground planes on the stripline side. As a result, the transition from stripline to CPW enables field rotation.

The dimensions of the CPW substrate thickness and the spacing between its non-metallized side and the bottom ground plane of the antenna are such that the LNB box 150 is flush with the antenna ground plane. The spacing between the metallized side of the CPW substrate and the top ground plane of the PDN or the radiating elements also are such that the LNB box does not protrude on the top side of the antenna.

Figure 3:
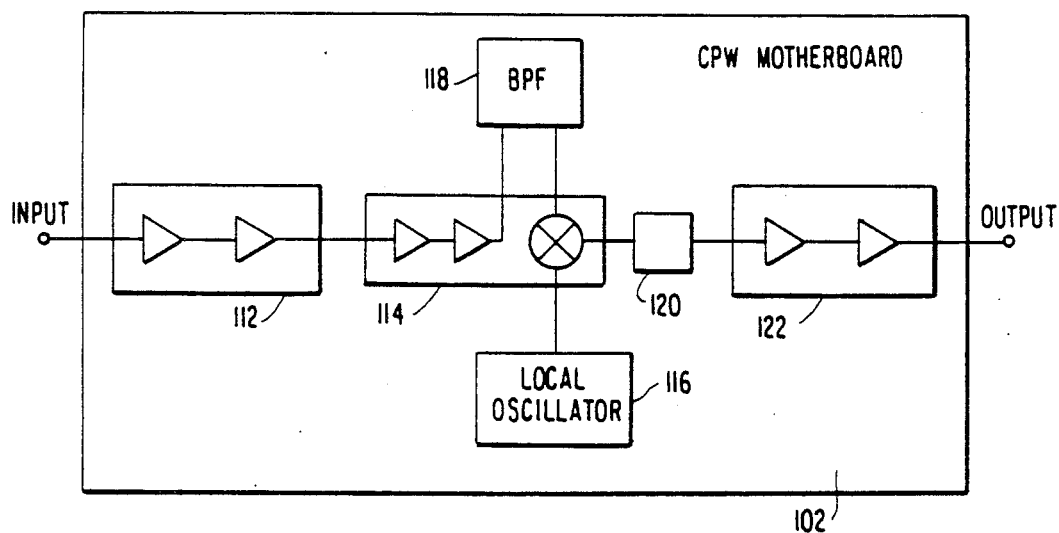
FIG. 3 is a block diagram of the LNB as incorporated on a ceramic or glass substrate.

FIG. 3 shows a block diagram of the circuitry incorporated on the CPW motherboard 102, and includes a miniature microwave active circuit (MMAC) (also referred to as quasi-monolithic) low noise amplifier (LNA) 112. The LNA 112 receives the antenna output, amplifies it, and provides the amplified output to a monolithic microwave integrated circuit (MMIC) LNA/mixer 114. The LNA/mixer 114 receives the output of a local oscillator (LO) 116 (which also may be implemented in MMAC). A band pass filter 118 is connected between the LNA and mixer portions of the LNA/mixer 114, so that the mixer portion combines the output of the LO 116 and a band pass filtered output of the MMIC LNA 112. The output of the LNA/mixer 114 is passed to a low pass filter 120, the output of which is passed to an IF amplifier 122, which also may be implemented in MMAC. The IF output of the LNB is a 75-ohm coaxial connector which conducts the IF signal to an indoor receiving unit, and at the same time delivers DC power to the LNB.

Figure 4:
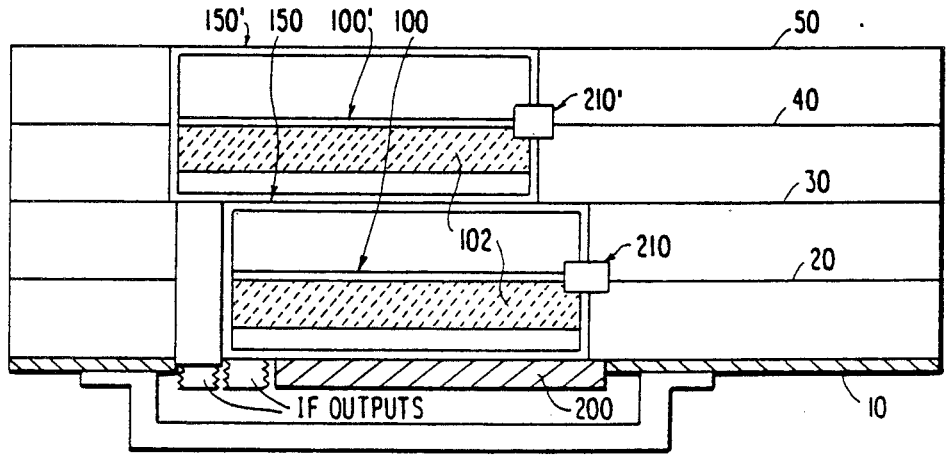
FIG. 4 shows an implementation of the invention in dual-polarization form, with LNBs disposed on respective power divider networks.

FIG. 4 shows a dual-polarized version of the present invention, in which LNB boxes are provided on each of the PDNs, the lower layer of radiating elements acting as a bottom ground plane for the upper array as described in the U.S. Pat. No. 4,929,959, Sorbello et al. As described in that last-mentioned copending application, a quadrature hybrid 200 may be connected to the dual-polarized antenna, to provide single or dual circular polarization or rotating linear polarization. The radiating elements and PDNs for the respective layers are disposed orthogonally to each other to provide orthogonal senses of polarization, either directly for the dual linear polarization case, or through the quadrature hybrid 200 for circular or rotating linear polarizations.

In FIG. 4, a second PDN layer 40 and a second radiating element layer 50 are added to the layers 10-30 shown in FIG. 1. The PDN layer 40 includes an LNB box 150' which is similar in construction to what is shown in FIG. 1. The element layer 50 has a number of elements omitted therefrom, in correspondence with the feed network structure missing from the PDN layer 40. This also is similar to what is done in layers 20 and 30.

As described above, and in accordance with the present invention, an LNB is incorporated onto a PDN layer of a flat plate antenna, and provides more compact structure with lower RF loss, with satisfactory sensitivity over a wide bandwidth. While the invention has been described in detail with respect to a preferred embodiment, many modifications within the spirit of the invention will be apparent to ordinarily skilled artisans. Thus, the invention should not be considered as limited to that embodiment, but rather is limited only by the scope of the appended claims which follow immediately.

What is claimed is:

1. A flat plate direct broadcase satellite (DBS) antenna/receiver combination, comprising:
   a ground plane;
   a power dividing network layer disposed over said ground plane and capacitively coupled thereto;
   a radiating element array disposed over said power divider network layer, and capacitively coupled thereto, said radiating element array comprising a plurality of radiating elements, ones of said radiating elements within said radiating element array being fed at at least a single point by corresponding elements of said power divider network; and
   a low noise block down-converter, disposed on a substrate and provided on said power divider network layer.

2. The combination recited in claim 1, wherein said low noise block down-converter comprises:
   first and second low noise amplifiers, an output of said first amplifier being connected to an input of said second amplifier;
   a band pass filter receiving an output of said second amplifier;
   a local oscillator;
   a mixer receiving outputs of said band pass filter and said local oscillator;
   a low pass filter connected to an output of said mixer;
   an IF amplifier connected to an output of said low pass filter;
   wherein said first amplifier receives an output of said antenna.

3. The combination recited in claim 2, wherein said power divider network layer is implemented in stripline, and said low noise block is connected via a coaxial connection to said power divider network layer, said low noise block connection being implemented in coplanar waveguide structure.

4. The combination recited in claim 3, wherein said coaxial connection comprises outer and inner portions, said outer portion being connected to said ground plane and to said radiating element layer, said inner portion of said coaxial connection being contacted to said stripline on one side and a center portion of said coplanar waveguide structure on the other, wherein a field which is output by said antenna is rotated via said coaxial connection and output to the low noise block down-converter.

5. The combination recited in claim 1, wherein said low noise block down-converter is disposed at a central portion of said power dividing network layer.

6. The combination recited in claim 1, further comprising a second power divider network layer disposed over said radiating element layer, and a second radiating element layer disposed over said second power divider network layer, said combination further comprising a second low noise block down-converter disposed on a glass substrate on said second power divider network.

7. The combination recited in claim 1, wherein said substrate comprises one of a low loss ceramic substrate and a glass substrate.

* * * * *